United States Patent
Da et al.

(10) Patent No.: US 6,329,245 B1
(45) Date of Patent: Dec. 11, 2001

(54) FLASH MEMORY ARRAY STRUCTURE WITH REDUCED BIT-LINE PITCH

(75) Inventors: Jin Da; Sung Rae Kim; Anqing Zhang, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/467,116

(22) Filed: Dec. 20, 1999

(51) Int. Cl.[7] ................................................ H01L 21/8247
(52) U.S. Cl. .......................... 438/264; 438/267; 438/594
(58) Field of Search .................... 438/257, 258, 438/264, 266, 267, 593, 594

(56) References Cited

U.S. PATENT DOCUMENTS

| | | | |
|---|---|---|---|
| 5,010,028 | * 4/1991 | Gill et al. | 438/594 |
| 5,107,313 | 4/1992 | Kohda et al. | 357/23.5 |
| 5,610,419 | 3/1997 | Tanaka | 257/315 |
| 5,620,913 | 4/1997 | Lee | 438/264 |
| 5,658,814 | 8/1997 | Lee | 438/588 |
| 5,721,441 | 2/1998 | Lee | 257/315 |
| 5,744,834 | 4/1998 | Lee | 257/321 |
| 5,918,125 | * 6/1999 | Guo et al. | 438/264 |
| 6,103,573 | * 8/2000 | Harari et al. | 438/264 |

FOREIGN PATENT DOCUMENTS

0282137 * 9/1988 (EP) .

* cited by examiner

*Primary Examiner*—Chandra Chaudhari
(74) *Attorney, Agent, or Firm*—George O. Saile; Rosemary L. S. Pike

(57) ABSTRACT

A new method is provided for the creation of floating gates of a flash memory array. The floating gates of conventional flash memory devices are formed using a single polysilicon deposition followed by a single polysilicon etch. The invention provides a method that allows for the reduction in the spacing between adjacent floating gates by providing a double polysilicon deposition followed by a double polysilicon etch process. The process of the invention starts with the formation of FOX regions in a semiconductor surface; the channel regions of the devices are implanted. The first half of the floating gates of the device are formed followed by the formation of the second half of the floating gates of the device. The control gate of the device is formed as a last step of the processes of the invention.

17 Claims, 8 Drawing Sheets

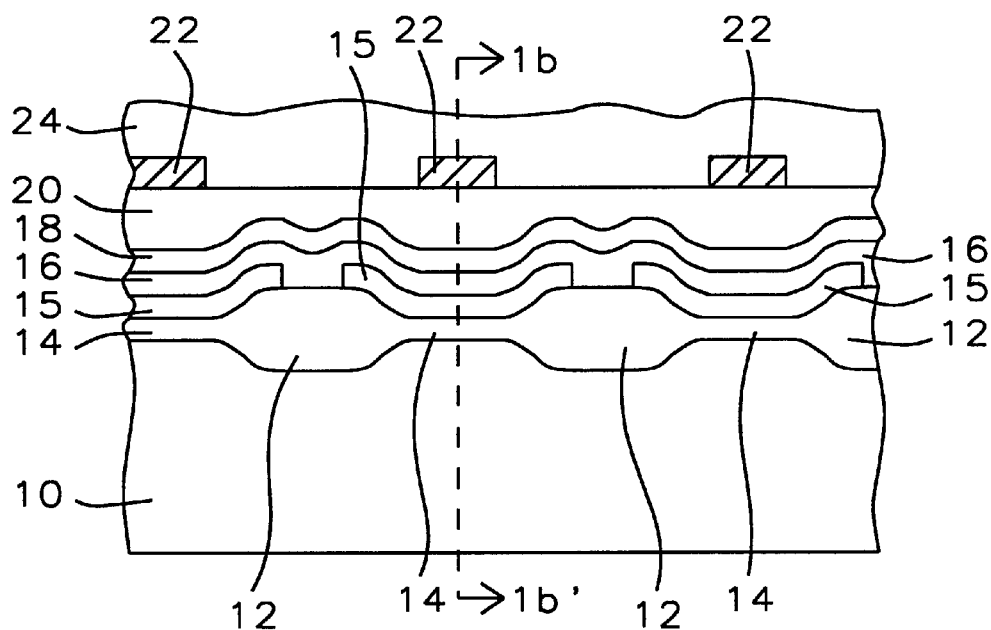
*FIG. 1a – Prior Art*
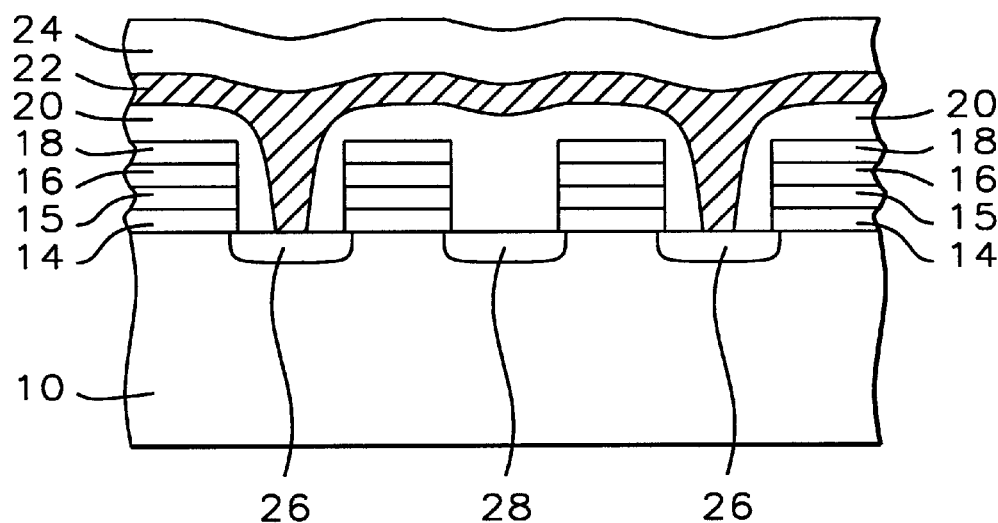
*FIG. 1b – Prior Art*

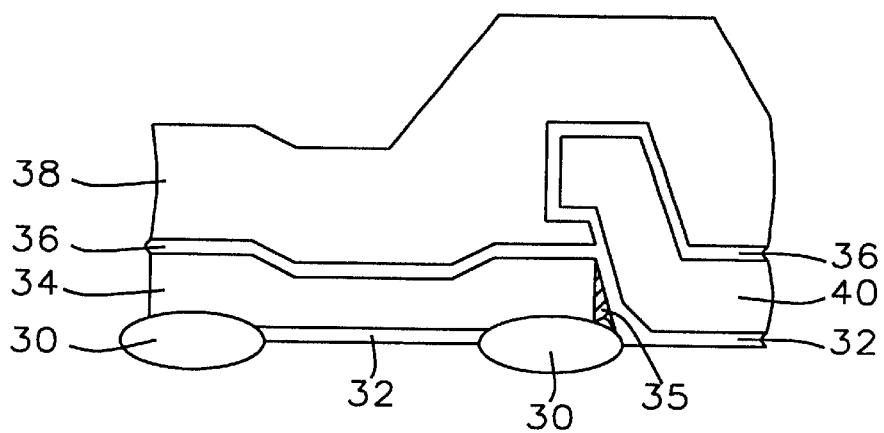
FIG. 2a – Prior Art
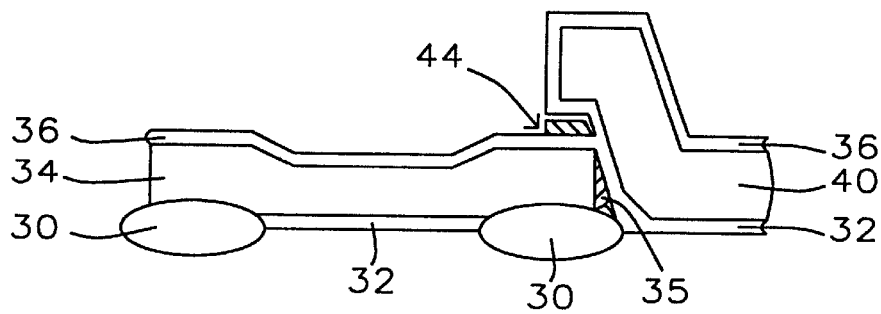
FIG. 2b – Prior Art
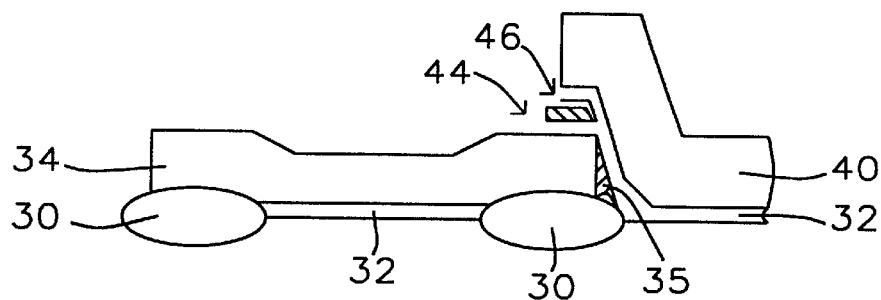
FIG. 2c – Prior Art
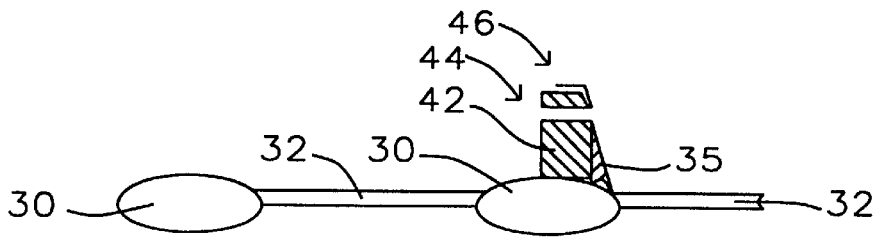
FIG. 2d – Prior Art

FLASH MEMORY ARRAY STRUCTURE WITH REDUCED BIT-LINE PITCH

BACKGROUND OF THE INVENTION

(1) Field of the Invention

The invention relates to the fabrication of integrated circuit devices, and more particularly, to a method for the creation of flash memory cells.

(2) Description of the Prior Art

Read Only Memory (ROM) devices, also referred to as mask-programmed devices, are non-volatile memories into which data is permanently stored through the use of custom masks during the fabrication of the devices. A desired bit pattern of the memory is in this manner imbedded into the device, each bit pattern being aimed at one particular application of the device. Only read operations can be performed, changes of the data contained in the memory cannot be made after the device has been fabricated. Customization of the device is however economically feasible since only one mask has to be used for the fabrication of the device. ROM devices have been implemented using bipolar, NMOS and CMOS technologies. A typical application of ROM devices is in the interface between central processors and other devices that make up a data processing system whereby the ROM devices eliminate wait states and improve system speed.

The different data elements are stored in a ROM device by the presence or absence of a data path that is formed between a word line (the access path) to a bit line (the sense line). No data element will be provided if the word line and the bit line are not joined by a circuit element. If therefore the word line of a ROM is activated, the presence of a signal on the bit line indicates that a "1" is stored in that data element (bit location). The absence of a signal on the bit line indicates that a "0" is stored in that bit location. The implementation of the ROM device uses either a complement of NOR functions or a complement of NAND functions. The imbedding of data in ROM devices (zero or one bit conditions) takes place by selectively omitting a contact.

Field-programmable ROM (PROM) devices are ROM devices that are typically manufactured in small quantities, these devices are programmed individually in order to save overall manufacturing costs. Some ROM devices are manufactured such that data, once entered into the device, cannot be erased while other ROM devices allow the data to be erased and re-entered after the device has been manufactured. Initially, such devices predominantly used bipolar technology but these devices are at this time also implemented using MOS technology. The erasable PROM's (EPROM's) depend on the long-term retention of data, this data is retained as an electronic charge and is stored on a polysilicon gate of a MOS device. The term floating in this structure refers to the fact that no electrical connections exist to the gate that retains the electrical charge. The charge is therefore transferred from the silicon substrate through an insulator. In order for the charge to be erased, the stored charge must be erased from the floating gate. This erasure can be achieved by exposing the EPROM to UV light for a time of up to about 20 minutes. This UV light creates a discharge path for the floating gate. EPROM cells typically consist of only one transistor making it possible to create very high-density arrays of EPROM cells. The UV light that is required to erase EPROM cells however brings with it the requirement that EPROM cells must be packaged in relatively expensive ceramic packages that contain a UV-transparent window. They must also, during the process of erasure, be removed from the printed circuit board and placed in a special UV eraser. To negate these disadvantages, electrically erasable PROM's (EEPROM's) have been created. These EEPROM devices are implemented using either floating-gate tunnel oxide (FLOTOX) MOS devices or using textured-polysilicon floating-gate MOS devices. FLOTOX MOS devices consist of a MOS transistor with two poly gates, the textured-polysilicon floating-gate MOS devices consists of three layers of poly that partially overlap to create a cell that acts as three MOS devices that are connected in series. In this arrangement, the floating-gate MOS device is formed in the middle of the poly structure, this device is encapsulated in $SiO_2$ in order to provide this device with high charge retention. The tunneling that is required to affect the charge transfer will, in this case, take place from one poly structure to another rather than from the substrate to the floating gate. Textured poly gates are programmed by causing electrons to flow (tunnel) from the floating poly structure to poly 3. A relatively high voltage is established on the poly 3 during both the programming and the erase operations. The drain voltage determines whether the tunneling occurs from poly 1 to the floating gate or from the floating gate to poly 3. The drain voltage therefore determines the final state of the memory cell.

Yet another design of the EEPROM cells is the flash EEPROM which has been named as such because all the memory cells can be rapidly and electrically erased in one operation. This operation of memory erasure can be performed on the entire memory array or on selected parts of the memory array down to the erasure of individual bytes within the memory array. The erasing mechanism of the flash EEPROM consists of tunneling off the region between the floating gate and the drain region of the MOS device. Programming the flash EEPROM is carried out by hot carrier injection into the gate of the MOS device. Flash EEPROM typically will use the erasure of relatively large regions of memory, the floating gate EEPROM's typically incorporate a separate select transistor which allows for the erasure of individual bytes.

Most flash EEPROM's use a double poly structure whereby the upper poly forms the control gate and the word lines of the structure while the lower poly is the floating gate. In a typical structure, the control-gate poly overlaps the channel region that is adjacent to the channel under the floating gate. The extension of the control gate over the channel region is referred to as the series enhancement-mode transistor and is required because when the cell is erased, a positive charge remains on the floating gate inverting the channel under floating gate. The series enhancement-mode transistor prevents the flow of current from the source to the drain regions of the MOS device.

A memory array is addressed via address decoding circuitry that consists of a word line or X-line decoder and a bit line or Y-line decoder. The memory cells that are at the intersection of the X-line and Y-line decoders form the memory cells that are addressed by the address that has been provided to the decoders.

FIGS. 1*a* and 1*b* show the conventional structure of an EPROM cell array. Where FIG. 1*a* shows a cross section of an array of EPROM cells that is taken in the X-direction, FIG. 1*b* shows a cross section of this array in the Y-direction and taken along the line 1*b*–1*b*' of FIG. 1*a*. The active regions in the surface of the substrate 10 are electrically isolated by the field oxide layers 12. For the purpose of the example that is shown in FIGS. 1*a* and 1*b*, the substrate selected is a p-type conductivity substrate. As a first step in the creation of the EPROM device, a layer (not shown) of sacrificial silicon oxide is grown on the surface of the p-type substrate to clean the edge of the field oxide regions 12, that is to remove or limit the extend of the "bird's beak" (regions of field oxide that laterally extend from the body of the field oxide region) that is typically part of the field oxide regions. The layer of sacrificial silicon oxide is then stripped before growth of the tunnel oxide (layer 14) in the active regions of the surface of the substrate. The thin layer 14 of tunnel oxide is formed over the exposed surface of the substrate 10 including the surface of the field oxide layers 12. A layer of polysilicon (poly 1, not shown) is deposited over the surface of the layer 14 of gate oxide, this layer of poly is selectively etched and forms the layers 15 that function as the floating gates 15 of the EPROM devices. A second layer 16 of inter-polysilicon ONO is deposited over the surface of the floating gates 15. The gate structure of the EPROM devices is completed by the overlying layer 18 of poly 2 which forms the control gate strip 18 that runs in the X-direction of the memory array interconnecting a plurality of control gates in that direction. The self-aligned floating gates are formed at the same time by selective etching. While masking one side of the gate electrode stack, an n-type implant is performed on the other side of the gate electrode stack and into the surface of the substrate 10 forming the n-type source (28) regions on the unmasked side of the gate electrode stack and in the surface of the substrate 10. The n-type implanted ions can be further driven into the surface of the substrate to make the source regions 28 deep regions. Ion implants of n-type are performed into the substrate to form (more shallow) N+ doped drain regions 26 on the other side of the gate electrode stack from the source regions 28. An insulating layer 20 is deposited over the structure that also covers the gate control strips 18. Openings are made in this layer of insulation above the drain regions 26. Electrical contact is established with the drain regions 26 of the structure by means of a plurality of metal strips 22 that are created in the Y-direction. On the other hand, the source region 28 is contacted (not shown in FIG. 1b) by metal lines that have been extended in the X-region of the array. A coating 24 of insulation overlies that metal strips 22.

For the EPROM cells that have been created in accordance with FIGS. 1a and 1b, when the drain region 26 and the control strips 18 are kept at a high voltage while the source region 28 is kept at a low or ground voltage, hot electrons that are created in the channel region between the source and drain regions are injected into the floating gate. A "0" value is therefore stored in the memory cell. When the voltage that is applied is reversed, the electrons that have accumulated in the memory cell are discharged resulting in a "1" being stored in the memory cell.

U.S. Pat. Nos. 5,721,441 (Lee) and 5,658,814 (Lee) show a method and structure for a Flash memory Cell comprising: double floating poly and double poly etch process to form overlapping TXs, see FIGS. 3 through 7, also see claim 1. This is close to the invention.

U.S. Pat. No. 5,107,313 (Kohda et al.) shows a flash memory process with closely spaced FG's and one overlying CG. This is close to the present invention, see FIG. 10.

U.S. Pat. Nos. 5,744,834 (Lee), 5,620,913 (Lee) and 5,610,419 (Tanaka) shows other memory process.

SUMMARY OF THE INVENTION

A principle objective of the invention is to provide a method of creating adjacent floating gates of a flash memory array that do not overlap.

Another objective of the invention is to sharply reduce or eliminate leakage current between adjacent floating gates of a flash memory array.

Yet another objective of the invention is to eliminate potential electrical shorts between adjacent floating gates of a flash memory array.

A still further objective of the invention is to provide a new insulation layer on the sidewalls of floating gates thereby further reducing the leakage current between adjacent floating gates of a flash memory array.

A still further objective of the invention is to reduce the space between adjacent floating gates of a flash memory array thereby reducing the required cell surface area of a flash memory array.

In accordance with the objectives of the invention a new method is provided for the creation of floating gates of a flash memory array. The floating gates of conventional flash memory devices are formed using a single polysilicon deposition followed by a single polysilicon etch. The invention provides a method that allows for the reduction in the spacing between adjacent floating gates by providing a double polysilicon deposition followed by a double polysilicon etch process. The process of the invention starts with the formation of FOX regions in a semiconductor surface. At first, tunnel oxide is formed on all exposed silicon surfaces due to the nature of the thermal oxidation. After the first layer of poly has been patterned and etched, the tunnel oxide can be wet cleaned in alternating regions. A first layer of poly 1 is deposited and patterned forming a first set of floating gates over the surface of the layers of first tunnel oxide and partially overlying adjacent FOX regions. A blanket first layer of ONO is formed over the surface of the first set of the floating gates, over the FOX regions and over the exposed semiconductor surface. The first layer of ONO is selectively removed over the semiconductor surface where as yet no floating gates have been created. The second tunnel oxide is formed over this latter surface, a second blanket deposition of poly 1 is performed, this layer of poly 1 is patterned to form the second and final set of floating gates overlying the second tunnel oxide. A second layer of ONO is formed over the surface of the floating gates, a layer of poly 2 is blanket deposited over the layer of ONO and patterned to form the control gates of the flash memory structure.

BRIEF DESCRIPTION OF THE DRAWINGS

FIGS. 1a and 1b show a cross section of a conventional EPROM structure, as follow:

FIG. 1a shows a cross section of an EPROM structure in an X-direction,

FIG. 1b shows a cross section of the same EPROM structure in the Y-direction.

FIGS. 2a through 2d show a series of processing steps that are aimed at partially creating an EPROM structure. The purpose of the processing steps that have been shown in FIGS. 2a through 2d show is to highlight the potential problems that relate to the current state of the art in forming EPROM structures. The drawings shown in FIGS. 2a through 2d show that, if overlap between adjacent floating gates is allowed (as is frequently stated in current patents relating to the art), a conductive polysilicon path will exist between adjacent floating gates. This is due to the nature of the stack gate etch. These conductive paths are highlighted as paths 42 and 44 in FIG. 2d.

Figure 3A:
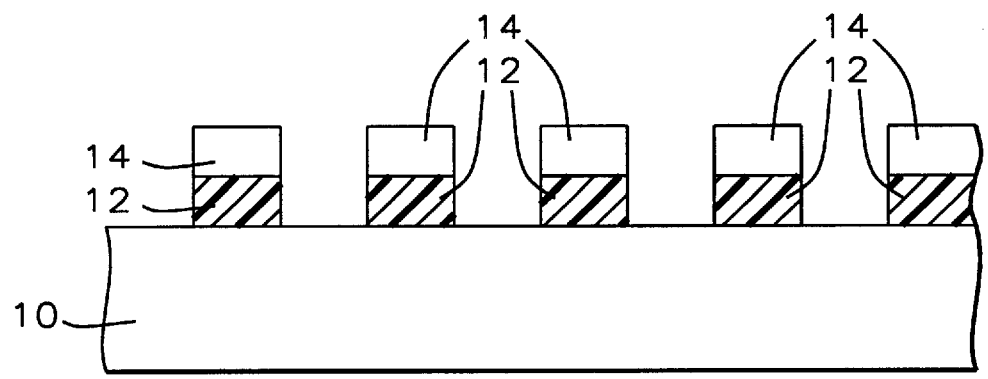

The processing steps that are highlighted in the drawings of FIGS. 2a through 2d use two etch steps for the creation of adjacent floating gates, as follows:

FIG. 2a shows a cross section of the deposition of two adjacent floating gates and a control gate over the active surface of a substrate, before the stack gate etch, FIG. 2b shows the cross section of the deposition of the two adjacent floating gates after the poly of the control gate has been removed, after the first stage of the stack gate etch i.e. control gate etch. This cross section clearly shows the residue (44) of the control gate that exists at the overlapping area, FIG. 2c shows a cross section of the deposition of two adjacent gates after the layer of ONO that overlays the floating gates has been removed, after the second stage of the stack gate etch, i.e. ONO etch, the control gate residue remains in place, FIG. 2d shows a cross section after the adjacent floating gates have been removed. This is after the last stage of the stack gate etch, i.e. poly 1 etch. Residues of the floating gate (42) remain in place while all the residue 44 is also still in place.

Figure 3B:
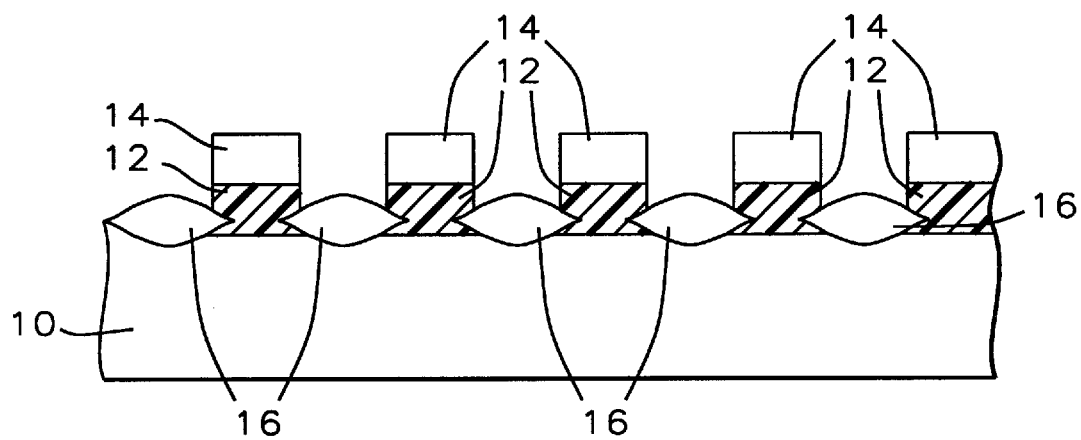
Figure 3C:
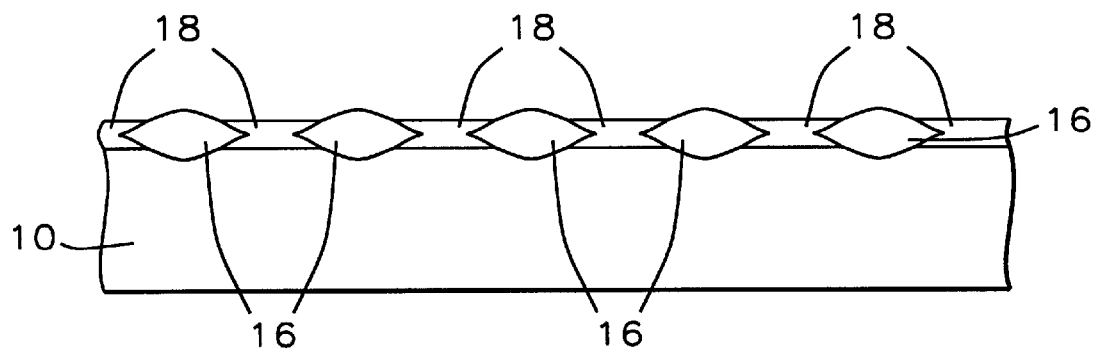
Figure 3D:
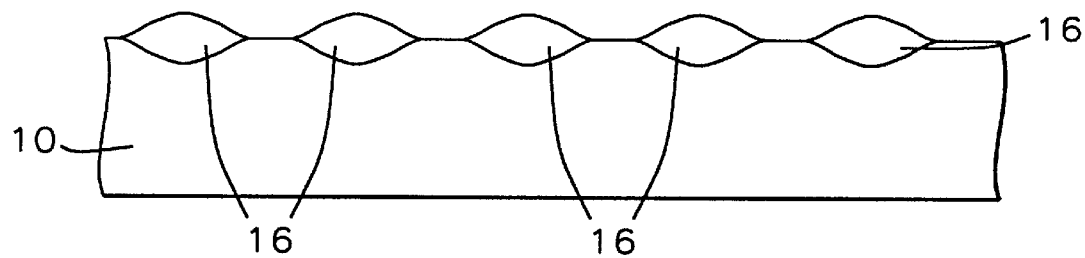
Figure 3E:
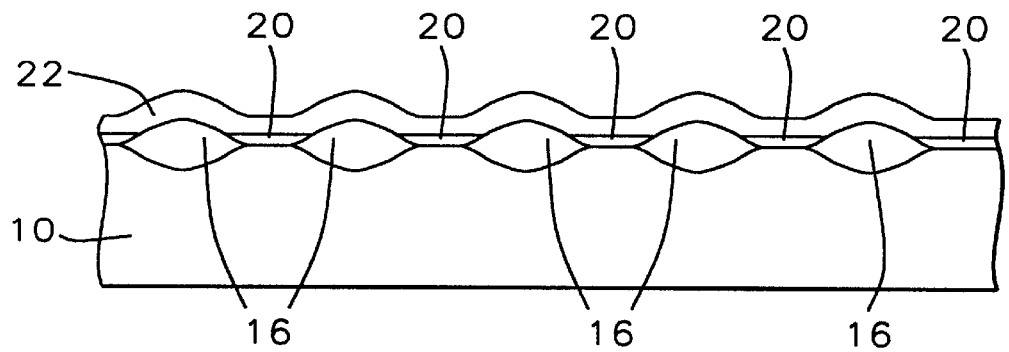
Figure 3F:
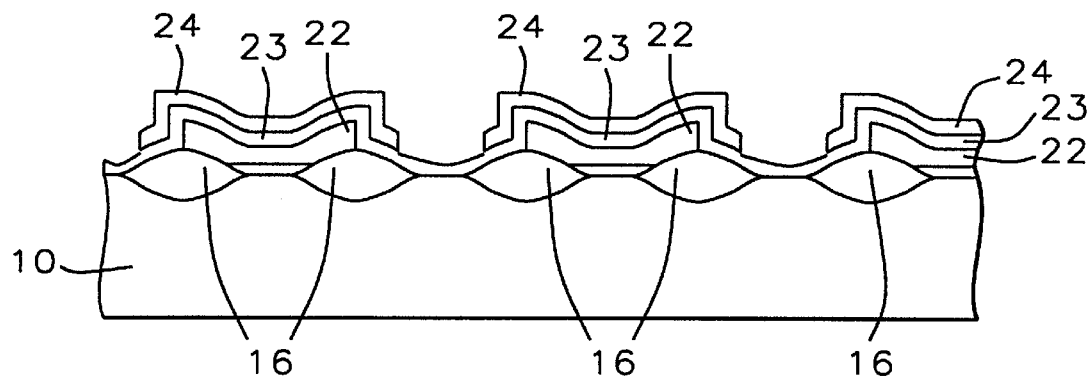

FIGS. 3a through 3L show a series of cross sections that highlight the process of the invention, as follows:

FIG. 3a shows a cross section after a layer of pad oxide has been grown over a semiconductor surface and after a layer of nitride has been deposited, masked and etched, FIG. 3b shows a cross section after the Field Oxide isolation regions have been created thereby electrically isolating the active surface areas, FIG. 3c shows a cross section after the nitride has been removed from the surface, after pad oxide has been grown and after the channel regions for the active devices have been implanted, FIG. 3d shows a cross section after the layer of pad oxide has been removed prior to the formation of the tunnel oxide, FIG. 3e shows a cross section after the formation of the first tunnel oxide and after the deposition of the layer of poly 1, FIG. 3f shows a cross section after the masking and etching of the layer of poly 1 thereby forming the first set of floating gates, the deposition of an insulation layer of ONO and the step of depositing, masking and etching the layer of photoresist over the surface where the second tunnel oxide is to be formed.

Figure 3G:
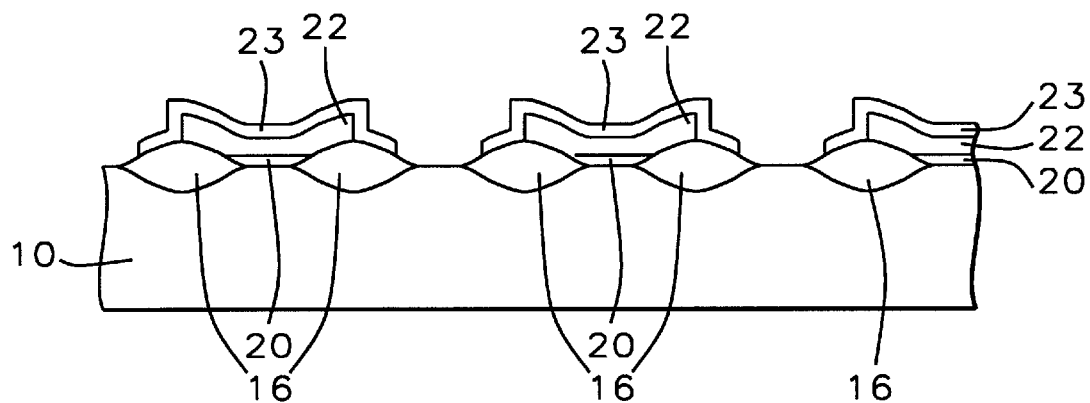
Figure 3H:
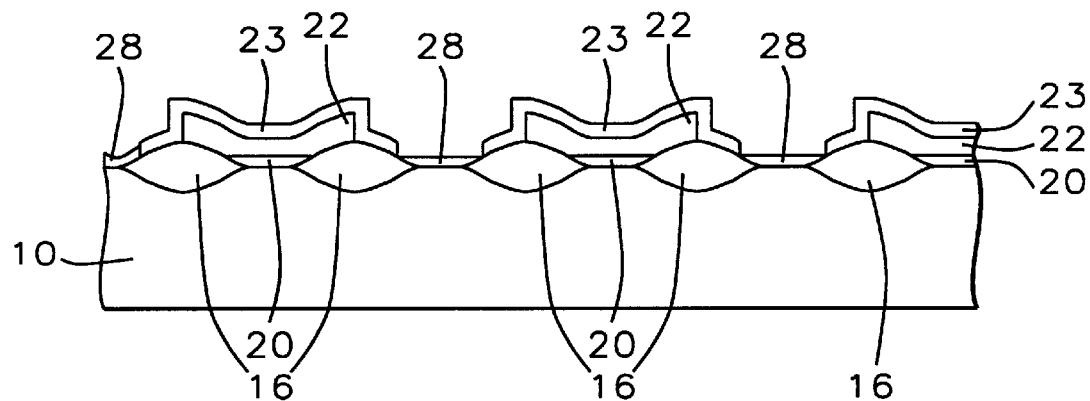
Figure 3I:
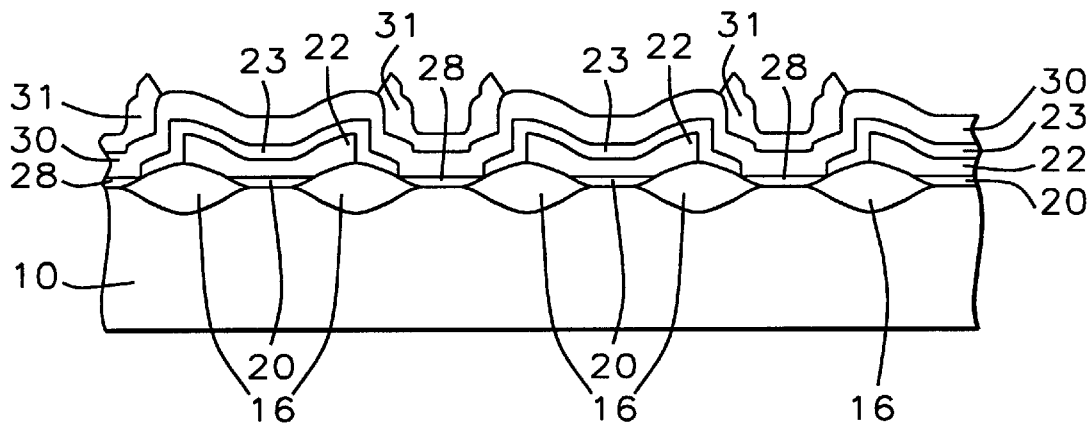
Figure 3J:
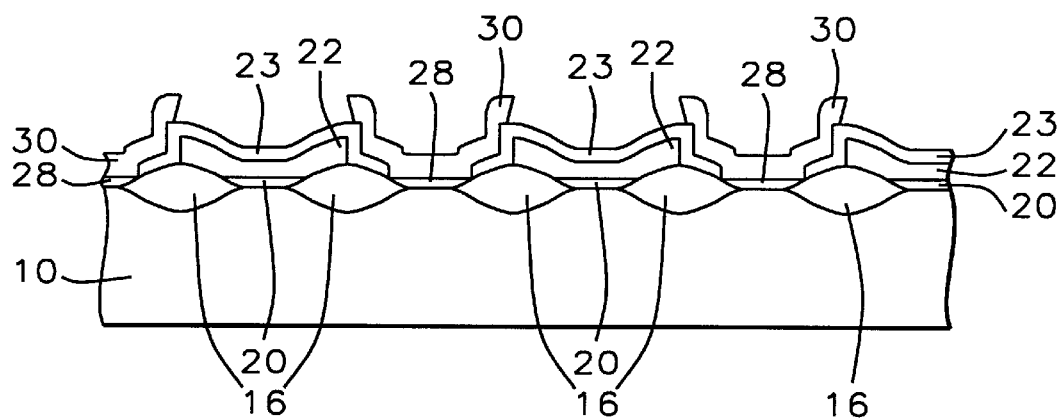
Figure 3K:
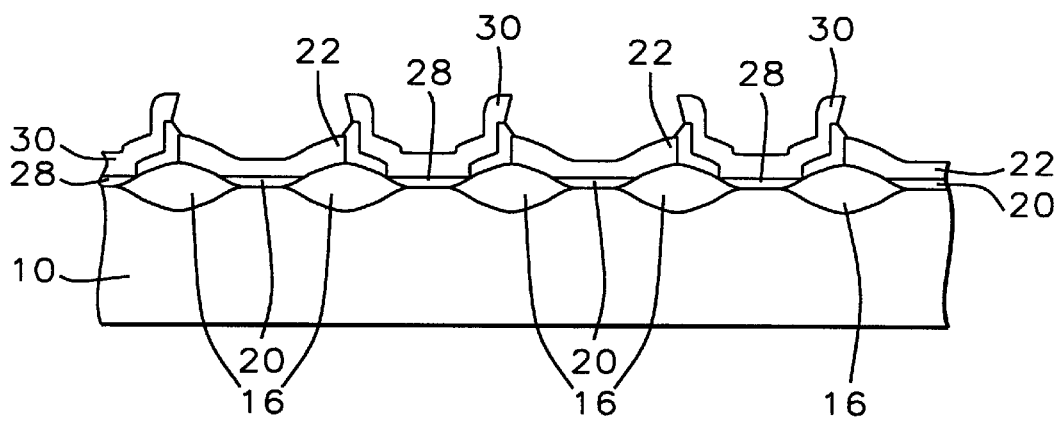
Figure 3L:
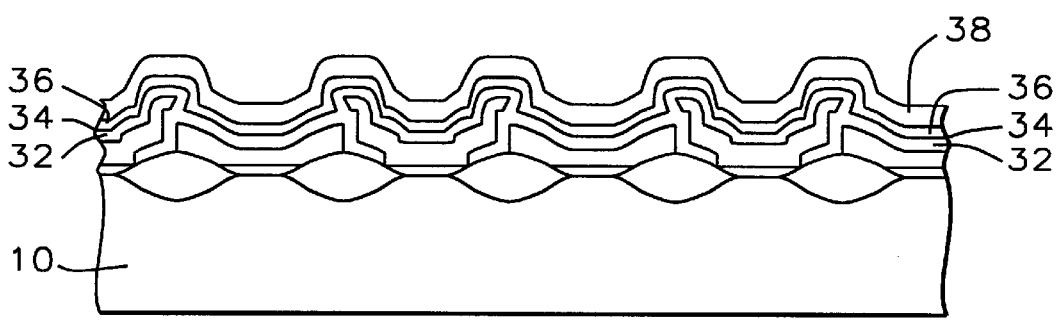

FIG. 3g shows a cross section after the removal of the layer of insulation of ONO over the surface where the second tunnel oxide is to be formed and the step of removing of the photoresist, FIG. 3h shows a cross section after the growth of the second tunnel oxide, FIG. 3i shows a cross section after the second deposition of a layer of poly 1 and the masking of the layer of poly 1, FIG. 3j shows a cross section after the etching of the second layer of poly 1 thereby forming the second set of floating gates and the removal of the layer of photoresist, FIG. 3k shows a cross section after the etch of the insulator and cleaning process, FIG. 3L shows a cross section after a second layer of ONO has been created, the layer of ONO is masked and etched to form a layer of ONO overlying the floating gates. A layer of poly 2 is deposited, masked and etched. The etching of the layer of poly 2 creates the control gate and exposes the sidewalls of the control gate, source and drain implant take place at this point. Spacers are formed on the control gate sidewall (not shown). The process of creating the EPROM can then be continued following standard backend process.

Figure 4A:
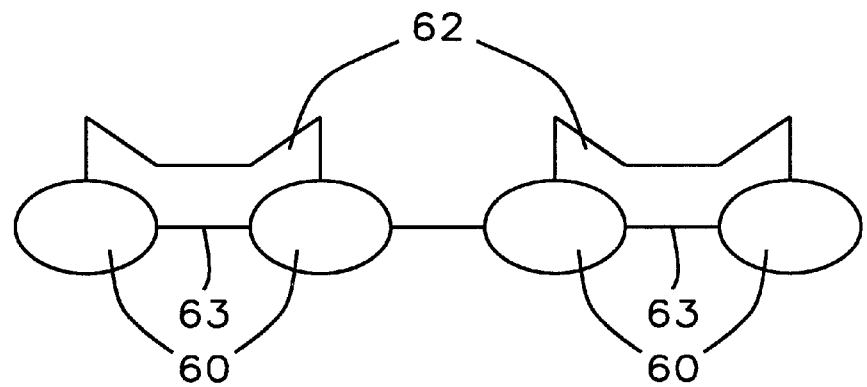
Figure 4B:
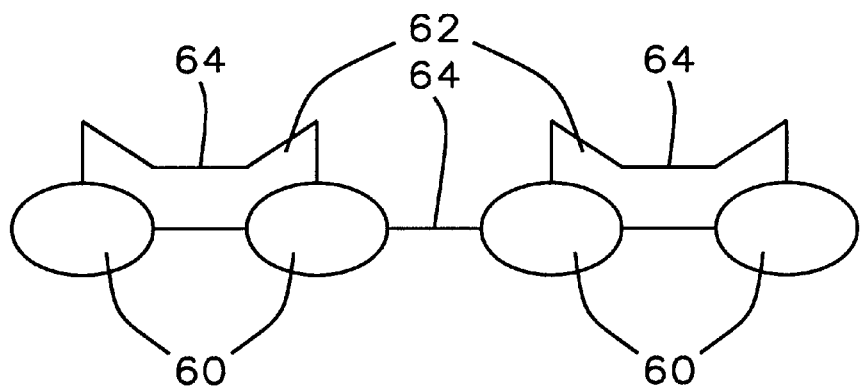
Figure 4C:
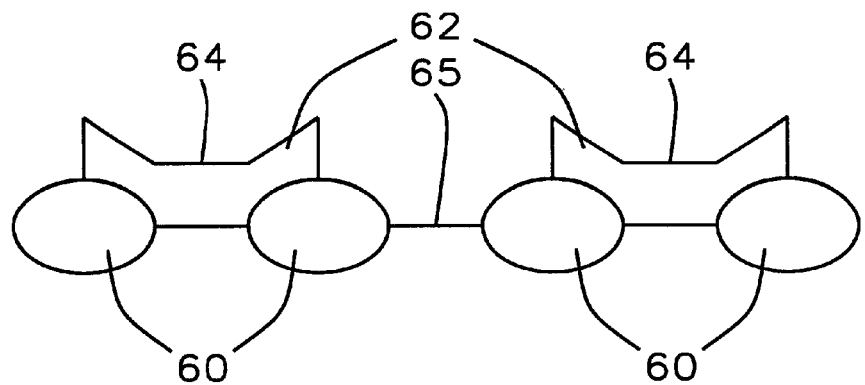
Figure 4D:
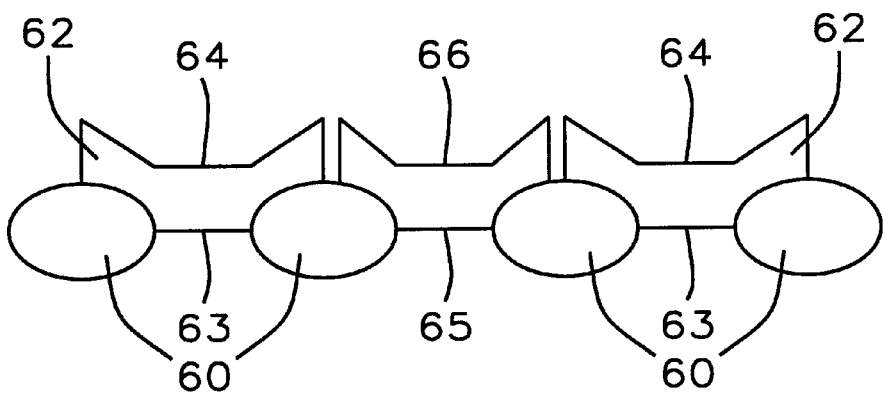
Figure 4E:
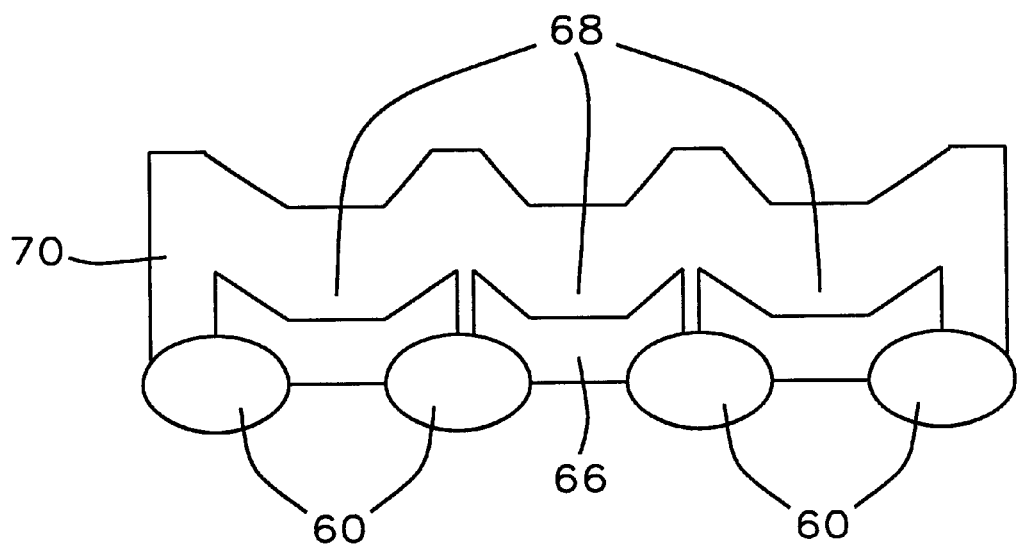

FIGS. 4a through 4e show an overview of the process of the invention, as follows:

FIG. 4a shows the FOX formation, the first tunnel oxide formation and the first poly 1 floating gate formation, FIG. 4b shows the first ONO formation, FIG. 4c shows partial cleaning of the ONO layer and the second tunnel formation, FIG. 4d shows the second poly 1 floating gate formation, and FIG. 4e shows the second ONO formation and the poly 2 control gate deposition, masking and etching.

DESCRIPTION OF THE PREFERRED EMBODIMENTS

Adjacent floating gates of an EPROM device can essentially be created using one poly deposition and one poly etch. To combine the best features of adjacent floating gates, and to reduce the space between adjacent floating gates, adjacent gates are under the process of the invention etched in two steps, that is a double floating poly deposition and a double poly etch to form the floating gates. This is further highlighted in FIGS. 2a through 2d, which are discussed next.

Using current processing technology, one of the major factors that limit the pitch of the flash memory size and therefore the cell size, is the large spacing that occurs between adjacent floating gates. For current 0.35 μm technology and using LOCOS isolation, the minimum spacing between floating gates is 0.4 μm. For current 0.25 μm technology using STI isolation, the minimum spacing between floating gates is 0.27 μm. The large spacing between adjacent floating gate is required to prevent charge leakage current from occurring between adjacent floating gates, which are typically used for charge storage. The main objective of the invention is to significantly reduce the spacing between adjacent floating gates while at the same time maintaining small leakage current between these gates.

FIGS. 2a through 2d show a cross section of the methods that are presently used in the art to form an EPROM device, these layers are the following: regions 30 are the field oxide isolation regions, layer 32 is the gate oxide layer, layer 34 is the (etched) poly 1 of the first floating gate, 35 forms the side-wall insulation between the first (34) and the second (40) floating gate, layer 36 is the layer of inter-polysilicon ONO, layer 38 is the poly 2 of the control gate while layer 40 is the (etched) adjacent or second floating gate. The sidewall insulation 35 between the first (34) and the second (40) floating gates is provided to reduce or prevent leakage current between adjacent floating gates. The processing step that will be applied after the layers as shown in FIG. 2a have been completed is the self-aligned gate etch (SAG), this SAG etch forms part of the conventional flash process. The SAG etch essentially contains three steps, these steps have been shown in cross section in FIGS. 2b through 2d. FIG. 2b shows a cross section after the unwanted layer 38 (FIG. 2a) has been removed. FIG. 2c shows a cross section after the layer 36 of ONO (FIG. 2a) has been removed. FIG. 2c shows a cross section after the gate oxide layers 34 and 40 (FIG. 2a) have been removed. The etch processes that are applied for the various procedures are, in order to control critical dimensions of the device, anisotropic etches. Where the first floating gate 34 and the second floating gate 40 are overlapping in design as shown in FIG. 2a, it is very likely that some of poly of the overlap will remain in place after the etch has been completed. This is shown in FIG. 2d where some (42) of the poly 1 of the first floating gate 34, some (46) of the layer 36 of ONO and some (44) of the layer 38 of the poly 2 of the control gate remains in place. This residue will form an electrical interconnect between adjacent floating gates in the bit-line direction causing shorts or have levels of leakage currents between adjacent floating gates. The invention is aimed at prevention this residue, that is the residue that has been shown in cross section in FIG. 2d.

The conventional processing sequence to form floating gate structures for an ERPROM device can be summarized as follows:

FOX formation tunnel oxide formation poly 1 floating gate deposition

ONO formation poly 2 control gate deposition, masking and etching, and spacer formation followed by back-end processing.

The cross sections shown in FIGS. 1a and 1b indicate the disadvantages of this approach, as follows:

large spacings between the floating gates which results in large areas required for the EPROM cells, and bad poly 2 topology which results in unwanted cracking of the poly 2 at shared corners of the created poly profile.

The processing sequence that is highlighted under FIG. 3a through FIG. 3L highlights the process of the invention.

Referring now specifically to FIG. 3a, there is shown a cross section after a thin thermal layer 12 of pad oxide has been grown over a semiconductor surface 10 and after a layer 14 of nitride has been deposited, masked and etched. The nitride 14 and the oxide layer 12 are etched to leave the openings that expose the portions of the silicon substrate 10 where local oxidation will take place. The pad-oxide layer is deposited on the bare silicon after the silicon surface has been cleaned. The layer consists of 20 to 60 nm. of $SiO_2$ and can be thermally grown on the surface of the wafer. The purpose of this layer is to cushion the transition of the stress between the silicon substrate and the subsequently deposited layer of nitride. In general, the thicker the layer of pad oxide, the less edge force is being transmitted from the nitride to the silicon. On the other hand, a thick layer of pad-oxide will render the nitride layer ineffective as an oxidation mask by allowing lateral oxidation to take place. Therefore, the minimum pad-oxide that will avoid the formation of dislocations should be used. As a rule of thumb, the minimum thickness of a thermally grown oxide layer should be at least one-third the thickness of the nitride layer. Typically, a blanket pad oxide can be formed to a thickness of about 110 Angstrom through a thermal oxidation method at a temperature of about 920 degrees C. for a time period of about 480 minutes.

One requirement of using nitride layers with CMOS processes, such as the LOCOS process or the growth of field oxide regions, is that the nitride layers must be patterned early in the process in preparation for field oxidation with little or no critical dimension bias. Critical dimension bias is defined as the difference in a feature measurement before and after a process flow step, such as comparing the dimension of a feature before being etched and after the etch is completed. The layer 14 of silicon nitride ($Si_3Ni_4$) can be deposited using LPCVD or PECVD procedures at a pressure between about 300 mTorr and 400 mTorr, at a temperature between about 600 and 800 degrees C., to a thickness between about 200 and 2000 Angstrom using $NH_3$ and $SiH_4$. The silicon nitride layer 14 can also be deposited using LPCVD or PECVD procedures using a reactant gas mixture such as dichlorosilane ($SiCl_2H_2$) and amonia ($NH_3$).

The silicon nitride layer 14 and the pad oxide layer 12 can be wet etched using a buffered oxide etchant (BOE). The BOE may comprise a mixed solution of fluoroammonium and fluorohydrogen (7:1) and phosphoric acid solution. The silicon nitride can also be etched using anisotropic RIE of the silicon nitride layer 14, using $CHF_3$ or $SF_6$—$O_2$ as an etchant. The silicon nitride layer 14 can also be dipped into phosphoric acid ($H_3PO_4$) to be removed; the thermal oxidation layer 12 can be dipped into hydrogen fluoride (HF) to be removed.

FIG. 3b shows a cross section after the Field Oxide isolations regions 16 have been created thereby electrically isolating the active surface areas of the device.

Field Oxide (FOX) isolation regions are used to electrically isolate active devices that are created on the surface of a semiconductor substrate, the field oxide layer 16 is thermally grown to not less than 3000 angstrom in thickness. When the field oxide is grown, the active regions remain covered by nitride, which prevents oxidation of the silicon beneath. In the field regions the surface of the silicon substrate has been exposed prior to field oxidation by etching away the nitride layers 14 in these areas.

If the field oxide is selectively grown without etching the silicon of the substrate, the resulting field oxide will be partially recessed. If, on the other hand, the silicon is etched after the oxide-preventing layer is patterned, the field oxide can be grown until it forms a planar surface with the silicon substrate. This is known as the fully recessed isolation oxide process. In the semi-recessed process, the height of the oxide protruding above the level of the active region surface is larger than in the fully recessed process, but it is smaller than in the grow-oxide-and-etch process. In addition, the semi-recessed oxide step 16 of FIG. 3b has a gentle slope that is more easily covered by subsequent polysilicon and metal layers.

The field oxide regions 16 can be grown to a thickness of about 500 to 900 nm. and are thermally grown by wet oxidation at temperatures of between about 900 and 1000 degrees C. for 4 to 8 hours.

FIG. 3c shows a cross section after the nitride (layer 14, FIG. 3b) has been removed from the surface, after a layer 18 of pad oxide has been grown and after the channel region for the active devices have been implanted (not shown). The processing conditions for the growing of the layer 18 of pad oxide have already been highlighted as have the processing conditions for the removal of the nitride.

Typical processing conditions for the creation of a doped channel region in the surface of said substrate is performing ion implanting with an energy of between about 25 and 180 KeV with an N+ dopant concentration of between about 1E14 and 9E15 atoms/$cm^2$.

FIG. 3d shows a cross section after the layer of pad oxide has been removed. The processing conditions for the pad oxide strip have also already previously been highlighted and need therefore not be further addressed at this point. The pad oxide must be removed at this time in order to enable the formation of the layer of tunnel oxide during following processing steps.

FIG. 3e shows a cross section after the formation of the layer 20 of tunnel oxide and after the deposition of the layer 22 of poly 1. The thickness of the layer 20 of tunnel oxide is typically between about 60 and 140 Angstrom and can be tailored thicker to be suitable for use with different source voltages. The layer of first tunnel oxide is thermally grown on the bare silicon after the silicon surface has been cleaned. The layer consists of between about 7 and 20 nm. of $SiO_2$.

FIG. 3e also shows the floating gate electrode polysilicon (poly 1) layer 22 that has been coated over the surface of the tunnel oxide 20 and the surface of the field oxide regions 16.

The layer 22 of poly 1 is deposited using LPCVD techniques to a thickness of between about 1,200 and 4,000 Angstrom and can be doped with ion implant of the required conductively, for instance using a n-type impurity of phosphorous at an energy of about 25 KeV to 180 KeV with a dose of between about 2E14 and 9E15 atoms/cm$^2$. Alternative, the doping of electrode floating gate layer of poly 2 can be achieved by CVD with a phosphorous liquid source such as phosphorous oxychloride (POCl$_3$) in a furnace at a temperature between about 850 and 950 degrees C. Again alternatively, in-situ doped poly can be used for poly 1 layer 22 deposited using LPCVD at a temperature between 530 and 600 degrees C. to a thickness between about 1200 and 4000 angstrom using SiH$_4$ and PH$_3$ as the source of dopant.

FIG. 3f shows a cross section after the masking and etching of the layer 22 of poly 1 thereby forming the first half of the floating gates, the deposition of a layer 23 of insulation of ONO, the deposition of a layer 24 of photoresist and the steps of masking and etching of the layer 24 of photoresist in preparation for the formation of the layers of second tunnel oxide.

The layer 22 of poly 1 can be etched using conventional photolithographic techniques using reactive ion etch (RIE), high plasma density etch or sputter etch techniques. The layer 22 of poly 1 is patterned using conventional photolithographic techniques to form the poly gate.

The preferred layer 23 of the invention is a layer of ONO. In depositing a layer of ONO, that is a layer of oxide-nitride-oxide, the first layer of oxide is native oxide or thermally grown oxide or CVD deposited oxide. The nitride is grown in a low power furnace at a temperature within the range of 600 to 700 degrees C. to a thickness within the range of between 40 and 200 Angstrom, the final oxidation layer is grown in a low power furnace at a temperature within the range between 750 and 800 degrees C. for a time period within the range between 30 and 60 minutes.

Layer 24 of FIG. 3f is a layer of photoresist that has been deposited, masked and etched in preparation for the removal of the layer of ONO above the surface where the layers of second tunnel oxide are to be formed.

FIG. 3g shows a cross section after the removal of the layer 23 of ONO above the surface where the layers of second tunnel oxide are to be formed and the step of removing of the photoresist 24 (FIG. 3f) that has been used to mask and etch the layer of ONO.

Photoresist stripping frequently uses sulfuric acid (H$_2$SO$_4$) and mixtures of H$_2$SO$_4$ with other oxidizing agents such as hydrogen peroxide (H$_2$O$_2$), the same components are frequently used in cleaning a wafer surface after the photoresist has been stripped.

FIG. 3h shows a cross section after the layers 28 of second tunnel oxide have been grown over the surface areas of the substrate that are not covered with the poly 1. The regions 28 (contained between the field oxide regions in the areas of the substrate surface that are not covered by the etched layers 22 of the first half of floating gates) of layers of second tunnel oxide consist of 70 to 200 Angstrom of SiO$_2$ and can be thermally grown on the surface of the wafer. During this growth of the second tunnel oxide, the layers 23 of ONO that overlay the poly 1 floating gates shield these floating gates from any effect that might be caused by the process of growing the (second) tunnel oxide 28.

At this point in the processing sequence it is of value to consider to what point the creation of the floating gates for an EPROM structure has progressed:

field oxide regions of isolation have been created
tunnel oxide has been formed for the floating gates
the first half of the floating gates has been formed
a layer of ONO has been created overlying the created floating gates.

FIG. 3i shows a cross section after the blanket deposition of a second layer 30 of poly 1 and the deposition and masking (shown in FIG. 3i) of layer 31 of photoresist. The patterning of layer 31 of photoresist uses masks that are the reverse masks of the masks that are used to pattern the first deposition of poly 1, this has been discussed previously under FIG. 3f. Due to this reverse mask, the layer 30 of the second deposition of poly 1 is etched away in the areas that overlay the first floating gates and leaves the second layer of poly 1 in place above the surface of the substrate where the layers of second tunnel oxide have been created. This results in the creation of the second half of the floating gates, this second half of floating gates completes the floating gates for the flash memory structure. The patterning of the layer 31 of photoresist leaves a spacing of about 0.12 µm (when measured in a direction that is parallel to the surface of the substrate 10) between the patterned floating gates 22 that have been created using the first deposited layer 22 of poly 1 and the patterned floating gates 30 that have been created using the second deposited layer 31 of poly 1. It will be recognized that this difference in spacing between the two sets of floating gates is critical since it is the spacing that prevents the overlap between adjacent floating gates that has been explained under the set of FIGS. 2a through 2d above.

FIG. 3j shows a cross section after the etching of the second deposition 30 of poly 1 and the removal of the layer of photoresist 31 (FIG. 3i) that has been used for the masking and etching of the layer 31 of poly 1. In place remain the adjacent floating gates 22 (etched from the first deposition of a layer of poly 1) and 30 (etched from the second deposition of a layer of poly1), the first tunnel oxide 20 and the second tunnel oxide 28, the layers 23 of ONO and the field oxide regions 16, all of the above placed as shown in FIG. 3j on the surface of the substrate 10. The cross section that is shown in FIG. 3j clearly shows the distance that exists between adjacent sets of floating gate structures (that is gate 22 and 30), a distance that, as already pointed out, is critical in avoiding leakage currents between adjacent floating gates.

FIG. 3k shows a cross section after the etch of the layers of ONO from above the first half of the floating gates, an etch that is followed by a cleaning process.

FIG. 3L shows a cross section after the creation of a second layer of ONO, that is the bottom layer 32 of ONO, has been created. A layer 34 of nitride has been deposited, the top layer 36 of ONO has been created, the combined layer of insulation (ONO-nitride-ONO) has been masked and etched to overlay two adjacent floating gates and the layer 38 of poly 2 has been deposited for the formation of the control gate.

In depositing a layer of ONO, that is a layer of oxidenitride-oxide, the first layer of oxide is native oxide or thermally grown oxide or CVD oxide. The nitride is grown in a low power furnace at a temperature within the range of 600 to 700 degrees C. to a thickness within the range of between 40 and 200 Angstrom, the final oxidation layer is grown in a low power furnace at a temperature within the range between 750 and 800 degrees C. for a time period within the range between 30 and 60 minutes.

Also shown in FIG. 3L is the deposition of layer 38 of poly 2. This layer is the layer of poly 2 that is used to form the control gates for the created floating gates. Layer 38 is masked and etched (not shown) thereby forming the control gate. After the etch of the layer 38 of poly 2 has been completed, the source/drain implant is performed, spacers are formed (not shown) on the sidewalls of the etched layer of poly 2. These spacers will enhance the electrical insulation between adjacent cells of the EPROM structure and will therefore further reduce or eliminate leakage current between adjacent cells. The processing that is shown is FIG. 3k essentially insulates adjacent cells of an EPROM structure and is followed by conventional back-end processing in order to complete the EPROM structure as has been indicated under FIGS. 1a and 1b above.

The source and drain implant is performed after the etch of layer 38 of poly 2 has been completed and the control gate has been formed, as indicated above. The implants for the source and the drain regions and the concomitant implants of the LDD regions for the source and drain regions are in accordance with conventional conditions of impurity implants. Examples for instance of a first conductivity imparting dopant, used to create a lightly doped source and drain region, is phosphorous, ion implanted at an energy between about 5 to 100 KeV, at a dose between about 1E11 to 1E14 atoms/cm$^2$. To create a medium doped source and drain region, arsenic or phosphorous can be used as an impurity, ion implanted at an energy between about 5 to 50 KeV, at a dose between about 1E12 to 5E14 atoms/cm$^2$. To create a heavily doped source and drain region, arsenic can be used as an impurity, ion implanted at an energy between about 5 to 150 KeV, at a dose between about 1E15 to 1E16 atoms/cm$^2$.

Gate spacers are typically formed using materials such as silicon nitride, silicon oxide, BSG, PSG, polysilicon, other materials preferably of a dielectric nature, CVD oxide formed from a TEOS source. Often used materials are amorphous materials that inhibit the deposition of epitaxial silicon thereupon. Spacers can for instance be formed by first depositing a layer of silicon oxide (see previous sentence) after which applying an anisotropic RIE procedure using CHF$_3$, CF$_4$ and H$_2$ as an etchant.

The process of the invention to form floating gate structures for an ERPROM device can be summarized as follows:
1) FOX formation
2) first tunnel oxide formation
3) first Poly 1 floating gate deposition, masking and etching to form half of the total required poly 1 floating gates in an alternating pattern
4) first ONO formation
5) use additional mask to clean ONO from the active region while the floating gate is not covered
6) second tunnel oxide formation on the remaining exposed active region
7) second Poly 1 floating gate deposition using the reverse mask of the first Poly 1 floating gate deposition to define the remaining floating gate lines
8) second ONO formation
9) poly 2 control gate deposition, masking and etch, and
10) spacer formation followed by back-end processing.

The advantages of the process of the invention are the following:
1) smaller spacings between the floating gates which results in smaller area requirements for the EPROM cells, and
2) smoother poly 2 topology, which eliminates unwanted cracking of the poly 2 at shared corners of the created poly 2 profile.

The processing sequence of the invention is shown in overview form under FIGS. 4a through 4e, whereby:

FIG. 4a reflects steps 1, 2 and 3 that have been detailed above, with 60 representing the FOX regions, 62 representing the first floating gate and 63 representing the first tunnel oxide, FIG. 4b reflects step 4 that has been detailed above, with 64 representing the ONO layer, FIG. 4c reflects steps 5 and 6 that have been detailed above where ONO is removed from region 65 and second tunnel oxide is formed in region 65

FIG. 4d reflects step 7 that has been detailed above, with 66 representing the second floating gate and FIG. 4e reflects steps 8 and 9 that have been detailed above, with 68 representing the formed ONO regions and 70 representing the control gate deposition.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming floating gates and control gates for flash memory transistors, comprising the steps in the sequence as follows:
   (a) providing a semiconductor substrate;
   (b) forming Field Oxide isolation regions in the surface of said substrate;
   (c) forming doped source and drain regions in the surface of said substrate;
   (d) forming a first half of floating gates for said flash memory transistors, wherein said forming a first half of floating gates for said flash memory transistors is:
      (i) forming layers of first tunnel oxide on the surface of said substrate;
      (ii) depositing a first layer of polysilicon 1 over said surface of said substrate thereby including the surface of said Field Oxide regions; and
      (iii) patterning said first layer of polysilicon 1 whereby said patterning essentially leaves in place said layer of poly 1 above the surface of said substrate between odd numbered pairs of Field Oxide regions thereby partially covering the Field Oxide regions that form said odd numbered pairs of Field Oxide regions whereby furthermore said poly 1 is essentially removed from above the surface of said substrate that is located between Field Oxide regions that form even numbered pairs of Field Oxide regions thereby furthermore partially removing said poly 1 from the Field Oxide regions that form said even numbered pairs of Field Oxide regions;
   (e) forming a second half of floating gates for said flash memory transistors; and
   (f) forming control gates for said flash memory transistors.

2. The method of claim 1 wherein said forming Field Oxide isolation regions in the surface of said substrate comprises the steps of:
   growing a layer of pad oxide over the surface of said substrate;
   depositing a layer of nitride over the surface of said layer of pad oxide;
   patterning said layer of nitride whereby openings are created in said layer of nitride that align with the surface areas of said substrate where the Field Oxide regions are to be formed;

growing said Field Oxide isolation regions; and removing said patterned layer of nitride.

3. The method of claim 1, whereby said Field Oxide regions are:

quantitatively subdivided into a first half and a second half; each Field Oxide region that is part of said first half of Field Oxide regions is adjacent to a Field Oxide region that belongs to said second half of Field Oxide regions;

adjacent Field Oxide regions form a pair of Field Oxide regions;

pairs of Field Oxide regions are assigned to even numbered pairs of Field Oxide regions or to odd numbered pairs of Field Oxide regions; and even numbered pairs of Field Oxide regions are adjacent to odd numbered Field Oxide regions.

4. The method of claim 1 wherein said forming a doped channel region in the surface of said substrate is:

forming a layer of sacrificial silicon oxide over the surface of said substrate;

performing a channel implant into the surface of said substrate, said channel implant being between said Field Oxide regions; and stripping said layer of sacrificial silicon oxide from the surface of said substrate.

5. The method of claim 1 wherein said forming layers of first tunnel oxide on the surface of said substrate is selectively growing regions of $SiO_2$ to a thickness of about 70 to 200 Angstrom whereby said first tunnel oxide is formed between Field Oxide regions that form odd numbered pairs of Field Oxide regions.

6. A method of forming floating gates and control gates for flash memory transistors, comprising the steps in the sequence as follows:

(a) providing a semiconductor substrate;

(b) forming Field Oxide isolation regions in the surface of said substrate;

(c) forming doped source and drain regions in the surface of said substrate;

(d) forming a first half of floating gates for said flash memory transistors;

(e) forming a second half of floating gates for said flash memory transistors, wherein said forming a second half of floating gates for said flash memory transistor is:

(i) depositing a first layer of insulation over the surface of said first half of floating gate structures thereby including the exposed surface of said Field Oxide regions thereby furthermore including the exposed surface of said substrate whereby said exposed surface of said substrate is located between Field Oxide regions that form even numbered pairs of Field Oxide regions;

(ii) depositing and patterning a layer of photoresist whereby said patterning leaves in place a layer of photoresist that essentially overlays said first half of floating gates whereby said patterned layer of photoresist extends by a measurable amount over the Field Oxide regions that are partially covered by said first half of floating gates;

(iii) removing said first layer of insulation from the surface of said substrate in accordance with said pattern of photoresist thereby removing said first layer of insulation from between said Field Oxide regions that form even numbered pairs of Field Oxide regions thereby furthermore partially removing said insulator from the surface of said Field Oxide regions that form even numbered pairs of Field Oxide regions;

(iv) removing remaining said layers of photoresist from above said first half of floating gates;

(v) forming layers of second tunnel oxide on exposed regions of said substrate;

(vi) depositing a second layer of polysilicon 1 over said surface of said substrate thereby including said first half of floating gates and their surrounding Field Oxide regions thereby furthermore including the surface of said substrate where said layers of second tunnel oxide have been formed;

(vii) masking said second layer of poly 1 with a layer of photoresist whereby said masking using a reverse mask of said first half of floating gates whereby openings are formed in said layer of photoresist that align with said first half of floating gates;

(viii) etching said second layer of poly 1 thereby forming layers of poly 1 that align with the surface of said substrate that is located between adjacent Field Oxide regions that form even numbered Field Oxide regions thereby forming said second half of said floating gates; and (ix) removing said photoresist that formed a mask in etching said second layer of poly 1; and (f) forming control gates for said flash memory transistors.

7. The method of claim 6 wherein said depositing a first layer of insulation over the surface of said first half of floating gate structures is a deposition of a layer of oxidenitride-oxide whereby a first layer of oxide is a native oxide whereby furthermore the nitride is grown in a low power furnace at a temperature within a range of 600 to 700 degrees C. to a thickness within a range of between 40 and 60 Angstrom whereby furthermore a final oxidation layer is grown in a low power furnace at a temperature within a range between 750 and 800 degrees C. for a time period within a range between 30 and 60 minutes.

8. The method of claim 6 wherein said forming layers of second tunnel oxide on the surface of said substrate is forming said second tunnel oxide on exposed surface areas of said substrate that are located between even numbered pairs of Field Oxide regions, said second tunnel oxide having a thickness of between about 70 to 200 Angstrom.

9. The method of claim 1 wherein said forming control gates for said flash memory transistor is:

removing a first layer of ONO overlying said first floating gates;

growing a second layer of ONO over the surface of first and second floating gates;

masking and etching said second layer of ONO whereby said second layer of ONO is left in place overlying said second floating gate and a set of two floating gates that surround said second floating gate;

depositing a layer of poly 2 over the surface of said first and second floating gates; and masking and etching said layer of poly 2 thereby leaving said poly 2 in place overlying said second floating gate and said set of two floating gates that surround said second floating gate furthermore leaving said layer of poly 2 in place partially overlaying Field Oxide regions that are adjacent to and isolate said combination of one second floating gate surrounded by first floating gates thereby creating said control gates whereby each control gate has a surface and sidewalls.

10. The method of claim 9 wherein said growing a second layer of ONO is the deposition of a layer of oxidenitride-oxide whereby the first layer of oxide is a native oxide or thermally grown oxide or CVD oxide whereby furthermore the nitride is grown in a low power furnace at a temperature within the range of 600 to 700 degrees C. to a thickness within a range of between 40 and 200 Angstrom whereby furthermore the final oxidation layer is grown in a low power furnace at a temperature within a range between 750 and 800 degrees C. for a time period within a range between 30 and 60 minutes.

11. The method of claim 9 with an additional step of forming gate spacers on said sidewalls of said control gates.

12. A method of forming a flash memory transistor, comprising the steps in the sequence as follows:

providing a semiconductor substrate;

growing a layer of sacrificial oxide on the surface of said substrate;

depositing a layer of nitride over said layer of sacrificial oxide;

patterning said layer of nitride thereby creating openings in said layer of nitride that extend to the surface of said layer of sacrificial oxide said openings to align with regions in the surface of said substrate where Field Oxide regions need to be formed;

forming Field Oxide isolation regions in the surface of said substrate whereby said Field Oxide regions are divided into adjacent even numbered and odd numbered pairs of Field Oxide regions;

removing said layer of patterned nitride;

forming a layer of pad oxide over the surface of said substrate;

performing a channel implant into the surface of said substrate, said channel implant being between said Field Oxide regions;

removing said layer of pad oxide from the surface of said substrate;

forming layers of first tunnel oxide on the surface of said substrate, said layers of tunnel oxide to be on the surface area of said substrate that is contained between said odd numbered pairs of Field Oxide regions;

depositing a first layer of polysilicon 1 over said surface of said substrate thereby including said layers of said first tunnel oxide thereby furthermore including the surface of said Field Oxide regions;

pattering said first layer of polysilicon 1 whereby said pattern creates layers of poly 1 that essentially align with the surface of said substrate that is between said odd numbered pairs of Field Oxide regions thereby creating a first half of floating gates;

depositing a first layer of insulation over the surface of said first half of floating gate structures thereby including exposed surface of said Field Oxide regions thereby furthermore including exposed surface of said substrate;

removing said first layer of insulation from above the surface of said substrate, said removed first layer of insulation being located between said even numbered pairs of Field Oxide regions, further removing said first layer of insulation from the surface of these even numbered pairs of Field Oxide regions over a measurable distance;

forming layers of second tunnel oxide on the surface of said substrate, said layers of second tunnel oxide to be located between the Field Oxide regions that form said even numbered pairs of Field Oxide regions;

blanket depositing a second layer of polysilicon 1 over said first half of floating gates thereby including the surface of said second tunnel oxide and adjacent Field Oxide regions;

depositing a layer of photoresist over the surface of said second layer of poly 1;

pattering said layer of photoresist using a reverse mask of the mask used in patterning said first half of floating gates thereby creating openings in said layer of photoresist that align with said first half of floating gates;

etching said second layer of poly 1 thereby creating a second half of floating gates thereby completing creation of floating gates for flash memory transistors whereby a distance between adjacent floating gate structures that belong to said first half and said second half respectively when measured in a direction that is parallel to the surface of said substrate is about 0.12 um;

removing said patterned layer of photoresist;

removing said remaining layers of insulation overlying said first half of floating gate structures;

depositing a second layer of ONO over the surface of said completed floating gate structures;

pattering said second layer of ONO thereby creating a pattern for control gates for said flash memory transistors;

depositing a layer of polysilicon 2 over the surface of said patterned second layer of insulation thereby including exposed surface of said substrate;

masking and etching said layer of poly 2 thereby creating control gates for said flash memory transistor;

performing source/drain implants; and creating spacers on sidewalls of said control gates.

13. The method of claim 12 wherein said source/drain implants are formed by ion implanting with an energy of between about 5 to 150 KeV with an N+ dopant concentration of between about 1E15 to 1E16 atoms/cm$^2$.

14. The method of claim 12 wherein said forming layers of first tunnel oxide on the surface of said substrate is selectively growing regions of $SiO_2$ to a thickness of about 70 to 200 Angstrom.

15. The method of claim 12 wherein said depositing a first layer of insulation over the surface of said first half of floating gate structures is a deposition of a layer of oxidenitride-oxide whereby a first layer of oxide is a native oxide or thermally grown oxide or CVD oxide whereby furthermore a layer of nitride is grown in a low power furnace at a temperature within a range of 600 to 700 degrees C. to a thickness within a range of between 40 and 200 Angstrom whereby furthermore a final oxidation layer is grown in a low power furnace at a temperature within a range between 750 and 800 degrees C. for a time period within a range between 30 and 60 minutes.

16. The method of claim 12 wherein said forming layers of second tunnel oxide on the surface of said substrate is forming said second tunnel oxide having a thickness of between about 70 and 200 Angstrom.

17. The method of claim 12 wherein said depositing a second layer of insulation over the surface of said completed floating gate structure is depositing a layer of ONO that is native oxide followed by a layer of nitride grown in a low power furnace at a temperature within a range of 600 to 700 degrees C. to a thickness within a range of between 40 and 200 Angstrom followed by a final oxidation layer that is grown in a low power furnace at a temperature within a range between 750 and 800 degrees C. for a time period within a range between 30 and 60 minutes.

* * * * *